(12) United States Patent
Parupalli et al.

(10) Patent No.: US 12,163,984 B2
(45) Date of Patent: Dec. 10, 2024

(54) COMPENSATING CURRENT MONITOR FOR ELECTRONIC SYSTEMS HAVING MODE-SENSITIVE SELECTION OF CURRENT-SENSING INPUTS

(71) Applicant: CIRRUS LOGIC INTERNATIONAL SEMICONDUCTOR LTD., Edinburgh (GB)

(72) Inventors: Vamsikrishna Parupalli, Austin, TX (US); Gaurav Agarwal, Austin, TX (US); John L Melanson, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 379 days.

(21) Appl. No.: 17/510,675

(22) Filed: Oct. 26, 2021

(65) Prior Publication Data

US 2023/0130120 A1   Apr. 27, 2023

(51) Int. Cl.
G01R 19/30 (2006.01)
G01R 15/08 (2006.01)

(52) U.S. Cl.
CPC ............. *G01R 19/30* (2013.01); *G01R 15/08* (2013.01)

(58) Field of Classification Search
CPC ............... G01R 19/0092; G01R 19/30; H02M 7/53803
See application file for complete search history.

(56) References Cited

U.S. PATENT DOCUMENTS

| | | |
|---|---|---|
| 5,550,450 A | 8/1996 | Palko et al. |
| 6,757,129 B2 | 6/2004 | Kuroiwa et al. |
| 6,995,537 B1 | 2/2006 | Plutowski et al. |
| 7,224,135 B1 | 5/2007 | Mengoli |
| 8,716,959 B2 | 5/2014 | David et al. |
| 9,219,414 B2 | 12/2015 | Shao |
| 9,654,689 B2 | 5/2017 | Gleason et al. |
| 9,735,574 B2 | 8/2017 | Tournatory et al. |
| 10,996,634 B2 | 5/2021 | Yao et al. |
| 11,070,177 B2 | 7/2021 | Singh et al. |

(Continued)

OTHER PUBLICATIONS

U.S. Appl. No. 17/230,789 entitled Cross-Over Distortionless Pulse-Width Modulated (PWM)/Linear Motor Control System, filed Apr. 14, 2021.

*Primary Examiner* — Jeff W Natalini
(74) *Attorney, Agent, or Firm* — Mitch Harris, Atty at Law, LLC; Andrew M. Harris

(57) ABSTRACT

Accurate operation of a current monitor is provided by injecting a bias voltage to a maintain de-selected sense amplifier input in an active state. An electronic system includes an output stage to supply a load current and includes two push-pull output drivers having sense resistors supplying a first and a second sense voltage. An included mode control circuit selects between a first and a second operating mode and selects a polarity of the current. An included current monitor receives the sense voltages and has a control input coupled to the mode selection control circuit. The current monitor provides an output that is dependent on both sense voltages in the first operating mode and is indicative of one of the sense voltages selected according to the selected polarity in the second operating mode. The bias voltage is injected into an unselected sense inputs to maintain active operation of the sense amplifier.

22 Claims, 6 Drawing Sheets

(56) References Cited

U.S. PATENT DOCUMENTS

| | | | |
|---|---|---|---|
| 11,115,046 B2 | 9/2021 | Parupalli et al. | |
| 2007/0285828 A1* | 12/2007 | Yamashita | G11B 5/54 |
| 2013/0314014 A1* | 11/2013 | Tremel | H02M 7/53871 |
| | | | 318/400.22 |
| 2019/0293691 A1* | 9/2019 | Holland | G01R 19/0092 |
| 2019/0379389 A1* | 12/2019 | Parupalli | H04N 23/667 |

\* cited by examiner

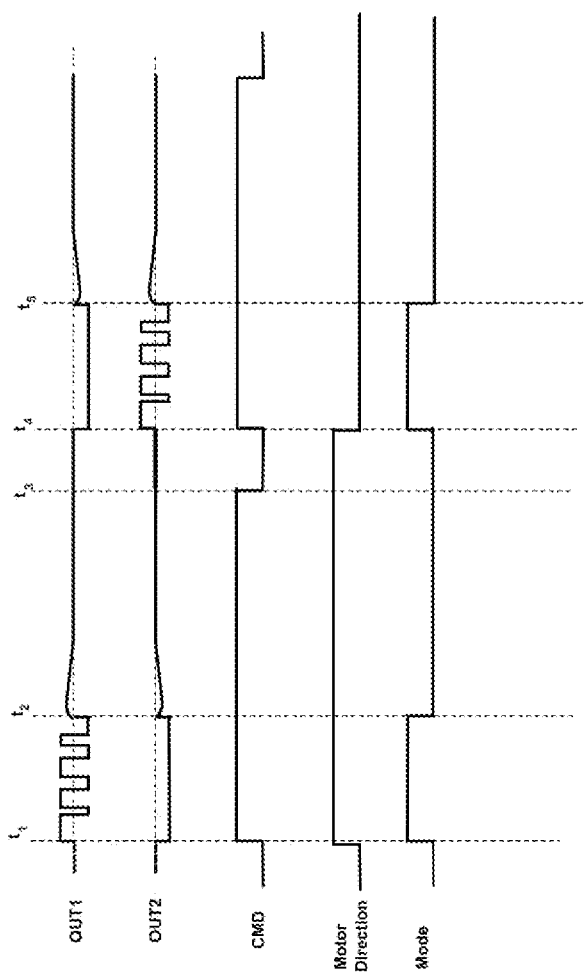

COMPENSATING CURRENT MONITOR FOR ELECTRONIC SYSTEMS HAVING MODE-SENSITIVE SELECTION OF CURRENT-SENSING INPUTS

BACKGROUND

1. Field of Disclosure

The field of representative embodiments of this disclosure relates to motor drivers and other power output electronics, such as haptic drivers that have selectable operating modes in which one or more current-monitoring inputs are decoupled in one or more operating modes, and in particular to current monitoring circuits in which bias error due to decoupled current-monitoring inputs is reduced or eliminated.

2. Background

In motor position controllers and other power output drivers, such as those for driving haptic feedback devices, a current-mode controller is needed to properly control the operation of the load. The current may be provided with high efficiency using a class-D type output, or low distortion, noise and offset using a linear amplifier. In particular, for motor and haptic controllers, a pulse-width modulated (PWM) output stage has been used in combination with linear output motor control to provide high-efficiency for large excursions and low distortion and offset error by transitioning to a linear control once the motor-driven position is close to the commanded position or for functions such as maintaining image focus (auto-focus) or image stabilization. Such operation enhances accuracy by providing a less noisy environment when the system is in a linear operation mode, while providing high power efficiency for large excursions when the system is in the PWM operating mode. The output stage is typically a push-pull pair of transistors and for cost/area efficiency it is desirable to use the same output devices for both the PWM operating mode and the linear operating mode.

However, when operating a fully-differential switch/amplifier, such as an H-bridge arrangement, while both PWM control and linear control may be implemented, the linear control is operated with class-B biasing, in order to match a closed-loop feedback transfer function of the PWM control in which one device on each side of the H-bridge is always off. Class-B biasing, by definition, introduces cross-over distortion that may be reduced, but not eliminated. Solutions to the cross-over distortion have been proposed that allow the linear mode to operate with Class-A or Class-AB biasing, while operating in PWM mode with Class-B biasing for efficiency. The proposed systems pulse-width modulate one half of the H-bridge, while setting the other half of the H-bridge to a state that depends on the polarity of current to be provided to the load. The modulated side and the source/sink side of the H-bridge can be swapped based on the polarity of the current, so that one side of the H-bridge is modulated, while the other always sinks current, which allows ground-referenced monitoring of current by including sense resistors in series with the N-channel (sink) transistors.

In such current monitors, which are used to determine the instantaneous current through the load, the voltage drop across the sense resistor on the source side in the linear operating mode corresponds only to the bias current, while the voltage drop across the sense resistor on the sink side corresponds to the bias current plus the load current. When the two voltages are subtracted the output of the current monitor corresponds only to the load current. In the PWM operating mode, the load current appears on the sink side of the H-bridge, as well, since on the sink side of the H-bridge, the current is always returning through the N-channel transistor. However, the current on the source side is switched based on the duty cycle of the PWM signal and therefore has a load current component that would generate an error in measured load current if subtracted from the current measured on the sink side. Disconnecting the source-side sense resistor from the current monitor removes the error due to the load current appearing on the source side sense resistor, but introduces other error due to the unselected current monitor input.

Therefore, it would be advantageous to operate a current-mode controller such that may operate selectively in PWM mode or linear mode that eliminates current monitor errors due to an unselected current monitor input.

SUMMARY

Improved current monitoring is accomplished in electronic systems, integrated circuits including the electronic systems and their methods of operation.

The electronic system includes an output stage for supplying a current to a load. The output stage includes a first push-pull driver providing a first output for coupling to a first terminal of the load and a first sense resistor for providing a first sense voltage indicative of a first current in the first push-pull driver. The output stage also includes a second push-pull driver providing a second output for coupling to a second terminal of the load and having a second sense resistor for providing a second sense voltage indicative of a second current in the second push-pull driver. The electronic system also includes a mode selection control circuit for selecting between a first operating mode and a second operating mode of the electronic system and for selecting a polarity of the current. The electronic system also includes a current measurement circuit for receiving the first sense voltage at a first sense input and the second sense voltage at a second sense input. The current measurement circuit has a control input coupled to the mode selection control circuit and provides a current measurement output that is dependent on both the first sense voltage and the second sense voltage in the first operating mode and is indicative of a selected one of the first sense voltage or the second sense voltage selected according to the selected polarity. The current measurement circuit includes a bias circuit that injects a bias voltage into an unselected one of the first sense input or the second sense input to maintain active operation of the unselected one of the first sense input or the second sense input.

The summary above is provided for brief explanation and does not restrict the scope of the claims. The description below sets forth example embodiments according to this disclosure. Further embodiments and implementations will be apparent to those having ordinary skill in the art. Persons having ordinary skill in the art will recognize that various equivalent techniques may be applied in lieu of, or in conjunction with, the embodiments discussed below, and all such equivalents are encompassed by the present disclosure.

BRIEF DESCRIPTION OF THE DRAWINGS

FIG. 6 is an example signal waveform diagram illustrating operation of motor control circuit 20C of FIG. 3, in accordance with an embodiment of the disclosure.

DETAILED DESCRIPTION OF ILLUSTRATIVE EMBODIMENT

The present disclosure encompasses electronic systems that circuits and integrated circuits that include improved current-mode control systems, amplifiers and other current-supplying device, and their methods of operation. The electronic system includes an output stage for supplying a current to a load. The output stage includes push-pull drivers that supply current to the load and have sense resistors supplying a first and a second sense voltage indicative of the current through one side of each of the push-pull drivers. A mode control circuit selects between a first and a second operating mode and selects a polarity of the current. A current monitor receives the sense voltages and has a control input coupled to the mode selection control circuit. The current monitor provides an output that is dependent on both sense voltages in the first operating mode and is indicative of one of the sense voltages selected according to the selected polarity in the second operating mode, so that, for example, error due to the load current appearing across both sense resistors in the second operating mode is not introduced. The bias voltage is injected into an unselected sense inputs to maintain active operation of the sense amplifier, so that error due to the unselected sense input of the current monitor is not introduced into the current measurement, which may form part of a feedback network around the electronic system.

Figure 1:
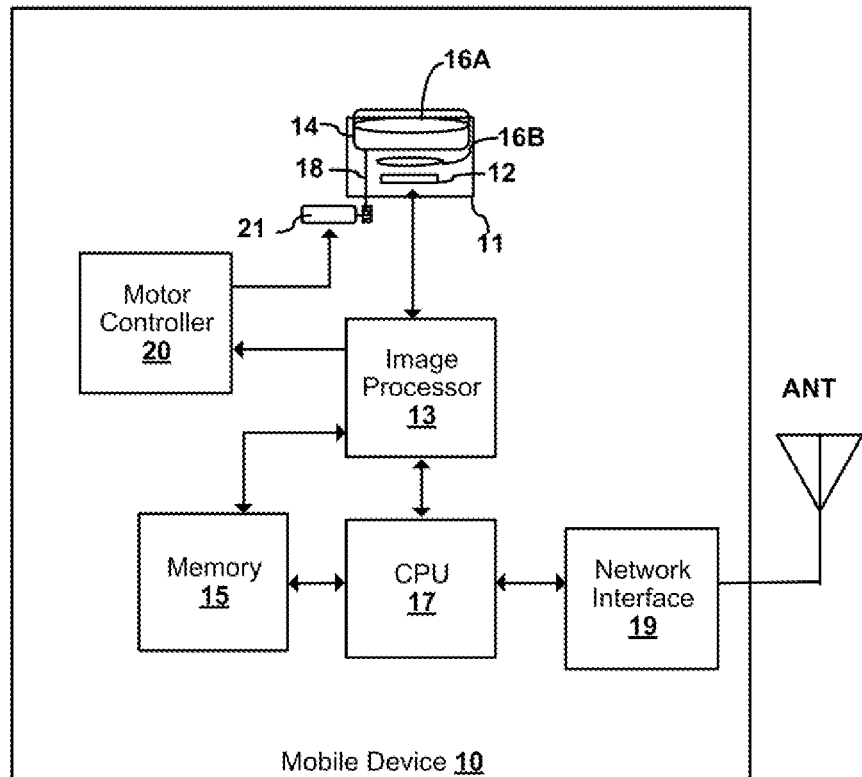
FIG. 1 is a block diagram illustrating a mobile device 10, in accordance with an embodiment of the disclosure.

Referring now to FIG. 1, a block diagram of an example mobile device 10 implementing an example electronic control system is shown, in accordance with an embodiment of the disclosure. Example mobile device 10 may be a wireless mobile telephone, tablet, notebook computer, or a similar device. Alternatively, mobile device may be a digital camera or other system that incorporates a position-controlled image sensor. Operation of mobile device 10 is controlled by a central processing unit (CPU) 17, which may be a microcontroller, microprocessor or other processor core, such as a processor core in a dedicated system-on-chip (SOC) implementation. CPU 17 is coupled to a memory 15 that stores program instructions forming a computer-program product, program data and other data such as media, including digital photographs. Memory 15 may include both non-volatile and dynamic storage elements. A network interface 19 provides for connection of mobile device 10 to a wireless network via an antenna ANT, but is not required for implementation of embodiments according to the disclosure, for example an electronic motor control system in a camera providing only a wired interface. A separate image processor 13 is also coupled to memory 15, and memory may comprise separate storage for program instructions forming another computer-program product, and data that may not be accessed directly by CPU 17. Image processor 13 provides an interface for receiving data from an image sensor 12 of a camera 11 within mobile device 10 and also provides an interface to a motor controller 20 that controls a motor 21 that positions a movable lens 16A, or multiple lenses, of camera 11, responsive to commands from image processor 13 that cause movement of a mount 14 via a mechanical linkage 18 coupled to motor 21. The commands are generally motor current commands to control the speed of the motor as computed by CPU 17 or image processor 13, which may provide zoom, auto-focus and image stabilization functions. Another fixed lens 16B receives an image from movable lens 16A to produce an image of the subject of a photograph or other image processing subject on image sensor 12.

Figure 2A:
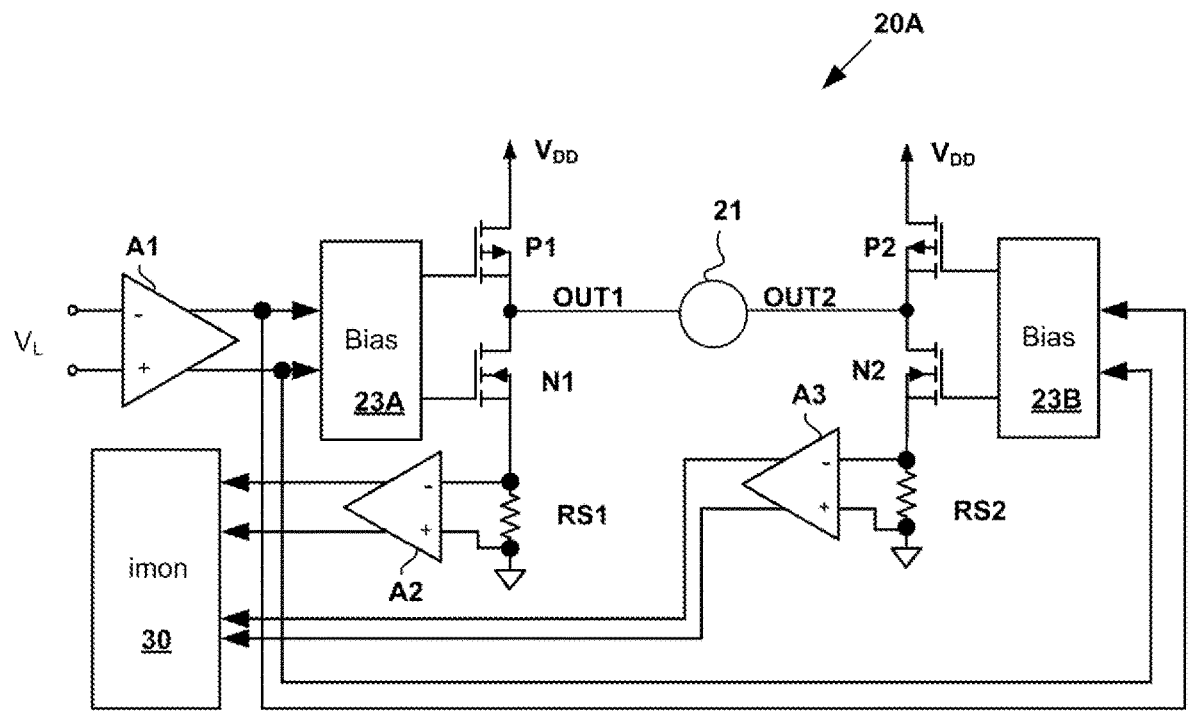
FIG. 2A is a block diagram illustrating an example output stage 20A of motor controller 20 of FIG. 1 operating in a linear operating mode and FIG. 2B is a block diagram illustrating an example output stage 20B of motor controller 20 of FIG. 1 in a pulse-width modulated (PWM) operating mode, in accordance with an embodiment of the disclosure.

Referring now to FIG. 2A, a simplified block diagram illustrating an example of an output stage 20A of motor controller 20 within mobile device 10 of FIG. 1 configured in a linear operating mode is shown, in accordance with an embodiment of the disclosure. An H-bridge circuit formed by transistors P1, P2, N1 and N2 are controlled by outputs of a differential amplifier A1 to provide operating current to motor 21 proportional to loop filter output voltage VL that is provided to the inputs of amplifier A1. A current monitor (imon) 30 provides an output that is a measure of the current provided through motor 21 by the H-bridge, a pair of sense amplifiers A2, A3 provide outputs indicative of the voltages across their corresponding sense resistors RS1 and RS2 that are included in the negative power supply (ground) connections of the corresponding H-bridge halves, i.e., in the path between the source of corresponding transistors N1 and N2 and ground. Bias circuits 23A, 23B set the quiescent operating current in respective sides of the H-bridge, i.e., quiescent current flowing from a positive power supply rail $V_{DD}$ through transistor P1 and through transistor N1 to a negative power supply rail $V_{SS}$, which may be ground, and quiescent current flowing from positive power supply rail $V_{DD}$ through transistor P1 and through transistor N2 to negative power supply rail $V_{SS}$. The bias of transistors P1, P2, N1 and N2 is set for class AB operation, so that when a loop filter output voltage VL provided to the input of an amplifier/pre-driver A1 that the input signals to the H-bridge through bias circuits 23A, 23B, has zero amplitude, a current is maintained flowing through each half of the H-bridge, avoiding cross-over distortion in the output signal provided to motor 21. The component of the sense voltages across sense resistors RS1 and RS2 due to the bias currents are equal in linear operating mode, and imon 30 subtracts the sense voltages, so that the error that would result in the load current measurement due to the biasing of the H-bridge halves in linear mode is canceled.

Figure 2B:
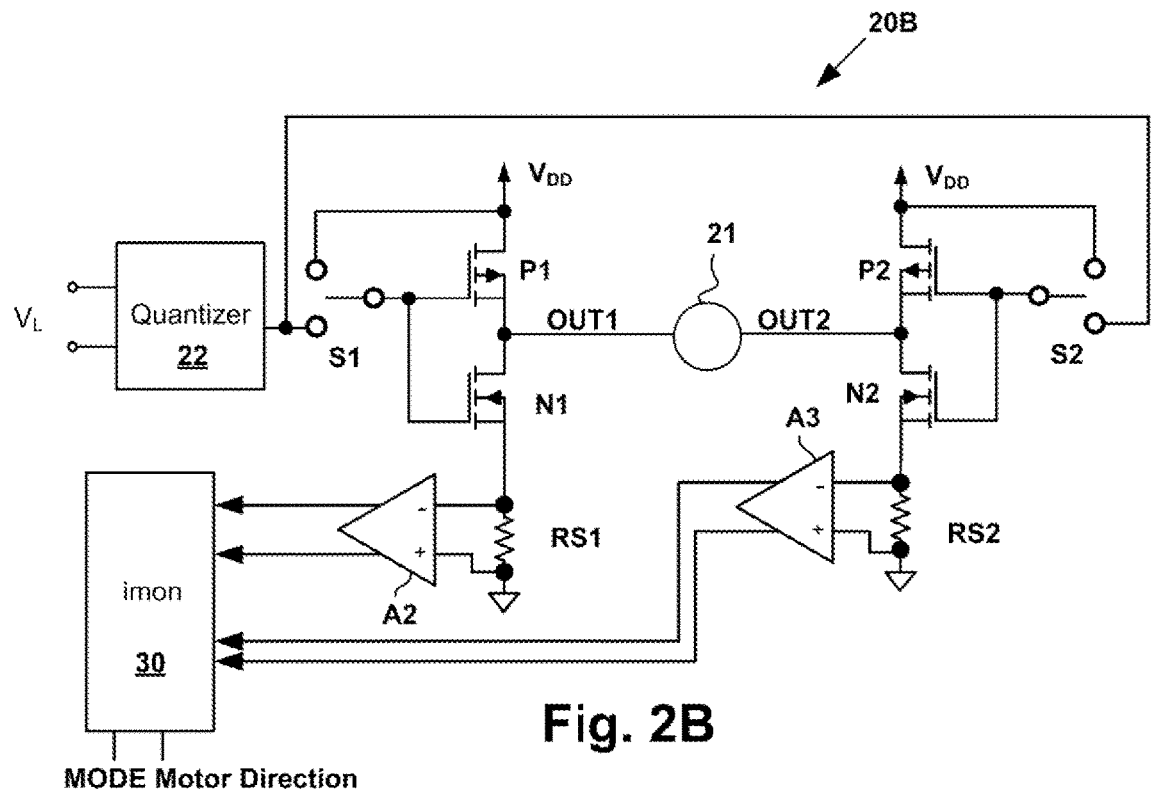

Referring now to FIG. 2B, a simplified block diagram illustrating an example of an output stage 20B of motor controller 20 within mobile device 10 of FIG. 1 configured in a pulse-width modulated (PWM) mode is shown, in accordance with an embodiment of the disclosure. A pair of switches S1, S2 select a left side or right side of the H-bridge circuit for PWM control by an output of a quantizer 22 that quantizes loop filter output voltage VL to provide operating current to motor 21. The other, unselected, side of the H-bridge has gate terminals of both transistors tied to power supply rail $V_{DD}$, so that the N-channel transistor (transistor N1 or transistor N2) is turned on and the P-channel transistor (transistor P1 or transistor P2) is turned off, thus the unselected side of the H-bridge will provide a fixed voltage close to the voltage of the negative power supply rail, which in the illustrated example, is ground. Selection of the modulated vs. fixed voltage side of the H-bridge circuit is controlled by a Motor Direction control signal, so that output stage 20B is operated in a single-ended mode, in which only one side of the H-bridge is modulated rather than using both sides of the H-bridge to differentially drive motor 21 in PWM mode. The disclosed architecture allows the H-bridge output driver formed by transistors P1, P2, N1 and N2 to be shared for both PWM mode and linear mode, rather than using separate linear mode drivers, which provides reduction of switching noise and allows the control loop to have the same response for the PWM mode as in the linear mode illustrated in FIG. 2A. However, in PWM mode, the sense resistor voltage due to the bias currents does not cancel, since the N-channel transistor on the side of the H-Bridge that is turned on is conducting the load current plus the bias current that turns on the N-channel transistor, while the N-channel transistor on the side of the H-bridge that is modulated conducts a bias current that is modulated by the PWM signal. Therefore, imon 30 corrects for the difference in the bias error across sense resistors RS1, RS2, by de-selecting the signals provided from the one of sense resistors RS1, RS2 through amplifiers A2, A3, on the modulated side of the H-bridge. However, as pointed out above, disconnecting the signal from one of sense resistors RS1, RS2 causes another error due to the disconnection. Therefore, in accordance with embodiments of the disclosure described below, imon 30 compensates for the disconnected sense resistor signal inputs by introducing a compensating bias, which may be a current or a voltage, depending on where the compensating bias is introduced, but represents a "missing" bias voltage from the deselected one of sense resistors RS1, RS2. Whether one of the inputs is deselected, and therefore, whether the compensation is applied, is determined by the state of a control signal MODE, which selects between the PWM or linear operating modes. Which input is de-selected and compensated by injecting a bias voltage is determined by a control signal Motor Direction that selects the side of the H-bridge that is modulated.

Figure 3:
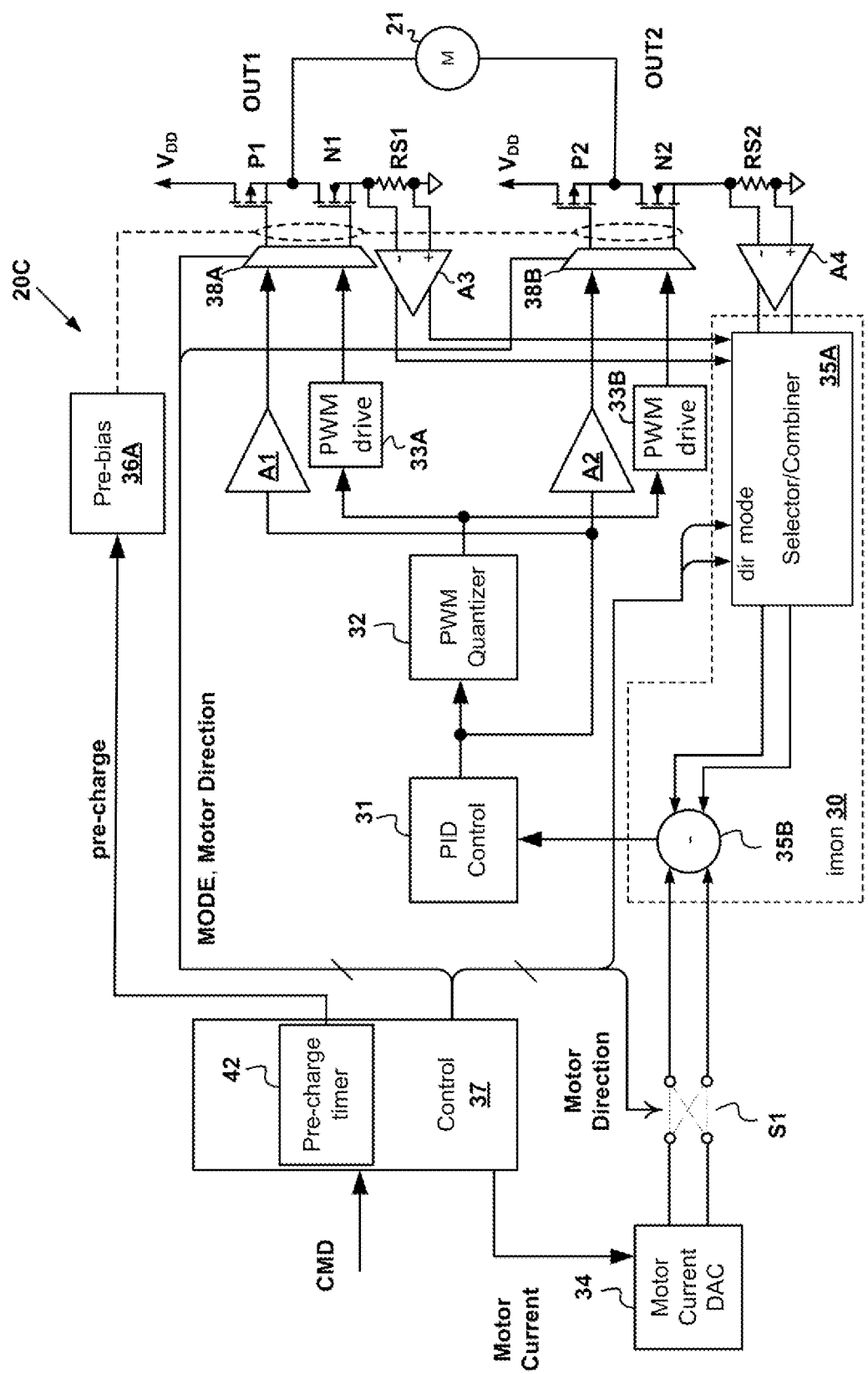
FIG. 3 is a simplified schematic diagram of an example motor controller 20C that may be used to implement motor controller 20 of FIG. 1, in accordance with an embodiment of the disclosure.

Referring now to FIG. 3, a simplified schematic diagram of an example motor controller 20C that may be used to implement motor controller 20 of FIG. 1 is shown, in accordance with an embodiment of the disclosure. Each half of an H-bridge formed by transistors P1, P2, N1 and N2 includes a current sense resistor RS1, RS2 that provide sense voltage inputs to current monitoring fully-differential amplifiers A3 and A4, respectively. In the linear operating mode, the voltages across both sense resistors RS1, RS2 are measured by fully-differential amplifiers A3 and A4 and are subtracted by a combiner 35A, which causes cancelation of measured class-AB bias current conducted by both sides of the H-bridge, while the motor current remains in the measurement, since only one of transistors N1 or N2 is conducting the motor current. As described in U.S. patent application Ser. No. 17/230,789 filed on Apr. 14, 2021, the disclosure of which is incorporated herein by reference, in PWM mode, the motor current may be sensed on the "sink" side, i.e., through the sense resistor RS1 or RS2 that is connected to one of transistors N1 or N2 that is turned on to sink current provided through motor 21 from the other side of the H-bridge. The current may be provided from a direction that is selected depending on the state of a control signal Motor Direction provided from a control circuit 37 and that selects one side of the H-bridge to operate statically, while the other side of the H-bridge is pulse-width modulated.

Input to example motor controller 30, is provided from CPU 17 or image processor 13 of FIG. 1, or both, to a control block 37. A motor current command, which is indicated by a command input CMD, includes a digital input value Motor Current provided to a motor current digital-to-analog converter (DAC) 34 that is coupled through cross-point switch S1, which interchanges the output signals of motor current DAC 34 to provide negative values corresponding to a reverse motor direction when control signal Motor Direction is asserted. Control signal MODE, which also may be provided by command input CMD, is sent to select linear or PWM operating mode. Control signal Mode sets the PWM operating mode when asserted and sets the linear operating mode when de-asserted. Control signal Mode may be provided by command input CMD or may be originated in control block 37, e.g., in response to continuous detection of position error, so that linear mode may be entered when the position error is small. Within imon 30, a selector/combiner 35A either combines the sense voltages provided from fully-differential amplifiers A3 and A4 when control signal Mode selects the linear operating mode, or selects one of the outputs of fully-differential amplifiers A3 and A4, based on the state of control signal Motor Direction. A combiner 35B generates feedback signals from a differential output of a selector/combiner 35A, which is subtracted from the direction-corrected motor current command value provided from switch S1, also as a differential voltage, which sets a commanded motor current level by generating the output of combiner 35B as a motor current error level, i.e., the difference between the current being delivered to motor 21 and the current commanded by motor current DAC 34. However, while a current-feedback topology is illustrated, the techniques of the present disclosure may be used in other topologies, such as open-loop controllers or controlled-voltage controllers, in which imon 30 provides monitoring of current to another component of the system, rather than providing control feedback. For example, in an audio system using voltage-only feedback, but that has both PWM and linear operation, the biasing scheme and the single-sided PWM operation described above may be employed. In such systems, imon 30 may be used for speaker protection, and for accurate current monitoring results, disconnection of the static leg of the H-bridge in PWM mode will result in more accurate determination of load current levels.

In the depicted embodiment, the output of combiner 35B is provided as an input to a proportional integral-derivative (PID) control block 31. PID control block 31 corrects for the phase difference between the motor current through the inductive load of motor 21 and generates an output that provides an input to a PWM quantizer 32, which generates PWM output signals that provide input to a pair of PWM drive blocks 33A and 33B. The outputs of PWM drive blocks 33A, 33B are provided as inputs to respective to selector blocks 38A, 38B. Selector blocks 38A, 38B select between providing the output of one of PWM drive blocks 33A, 33B to a side of the H-bridge that is being modulated when a control signal MODE is asserted, while enabling the N-channel transistor N1 or N2 on the other side of H-bridge to conduct the current returning from motor 21 to the power supply return. The P-channel transistor P1 or P2 on the non-modulated side of the H-bridge is turned off by the corresponding of selector blocks 38A, 38B or by an external pull-up configuration (not shown).

In the linear operating mode, as selected by control block 37 de-asserting control signal MODE, the outputs of both of a pair of linear driver amplifiers A1, A2 are coupled to their corresponding side of the H-bridge. Linear driver amplifiers A1, A2 also receive the output of PID control block 31, so that a common feedback loop may be shared between linear and PWM mode drive. Linear driver amplifiers A1, A2 have a gain that compensates for the difference between the single-ended PWM signal generated by only one half of the H-bridge vs. the differential signaling during operation of the H-bridge in linear mode, e.g., an attenuation of ½. Selector blocks 38A, 38B, also include the bias resistors or active bias circuits that bias transistors P1, P2, N1 and N2 to provide Class AB bias when linear mode is selected, i.e., all of transistors P1, P2, N1 and N2 conduct a bias current in addition to signal current. For single-ended operation, a class-A bias may be employed instead, for the single push-pull output stage implementing the single-ended output.

Figure 4:
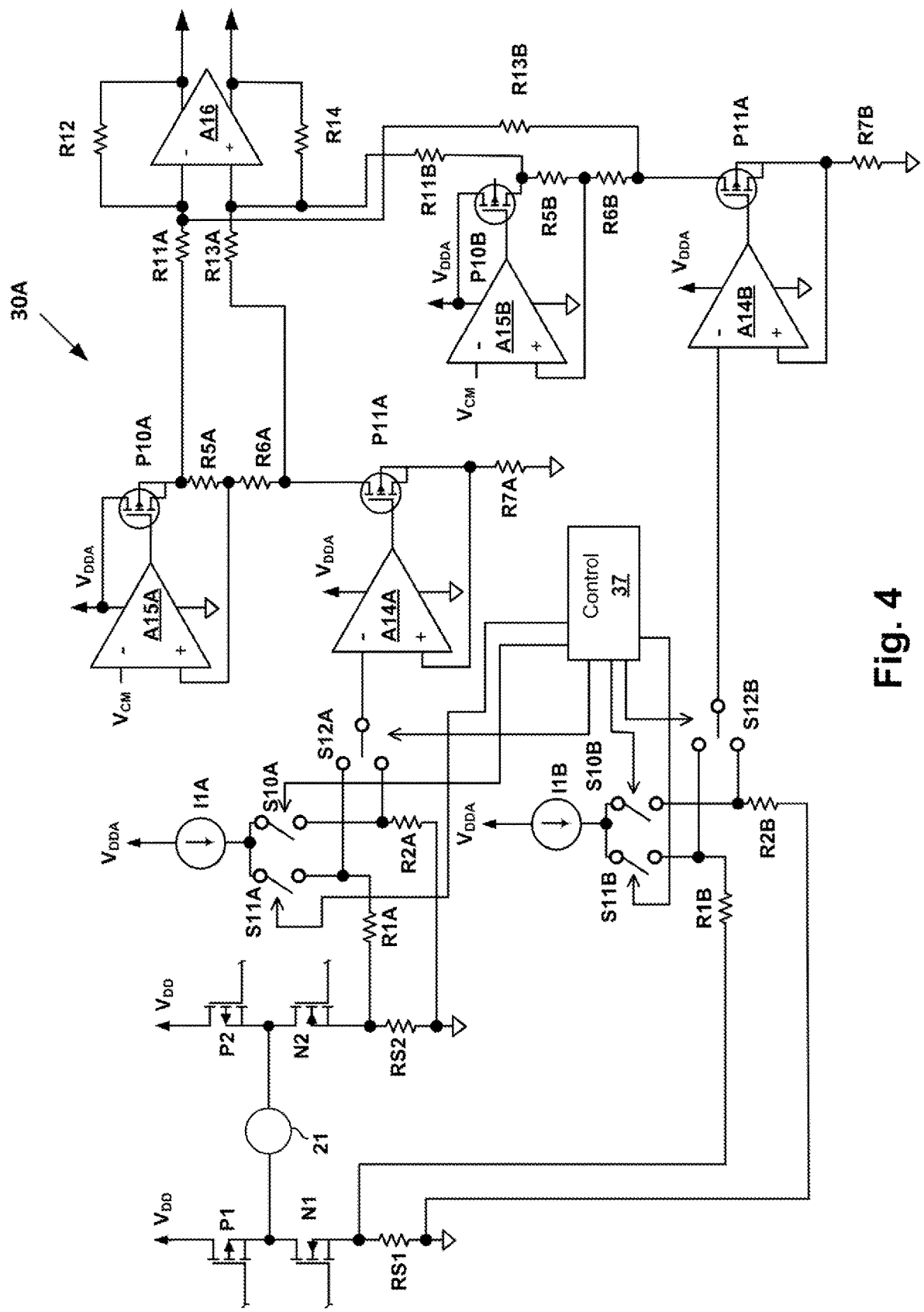
FIG. 4 is a simplified schematic diagram of an example current monitor circuit 30A that may be used to implement current monitor 30 of FIG. 3, in accordance with an embodiment of the disclosure.

Referring now to FIG. 4, a simplified schematic diagram of an example imon (current monitor) circuit 30A that may be used to implement imon 30 of FIG. 2A and FIG. 2B is shown, in accordance with an embodiment of the disclosure. In the depicted embodiment, a pair of voltage-controlled current sources are implemented by amplifiers A14A, A14B and resistors R7A, R7B. Switches S12A, S12B select whether or not their corresponding sense resistor RS2, RS1 will be coupled to the current-monitor input via resistors R1A, R1B. In linear mode, as described above both of switches S12A, S12B select input through resistors R1A, R1B. In PWM mode, the direction of the current will determine a selected one of switches S12A, S12B to activate, and thereby select input through one of resistors R1A, R1B. For the un-selected sense resistor, the other unselected one of switches S12A, S12B, will select input through one of resistors R2A, R2B, which couple the unselected input to ground. Switch S11A and S10A selectively couple current source HA to inject a current into input resistor R1A if sense resistor RS2 is selected for sensing, or into resistor R2A if sense resistor RS1 is selected for sensing. Switch S11B and S10B selectively couple current source to inject a current into input resistor R1B if sense resistor RS1 is selected for sensing, or into resistor R2B if sense resistor RS2 is selected for sensing. The resistances of resistors R1A, R1B, R2A and R2B may be equal and have a resistance substantially greater than that of sense resistors RS1 and RS2, so that an equal bias voltage is injected into the current monitor inputs, irrespective of which input(s) from sense resistors RS1 and RS2 are selected to contribute to the current measurement. Switches S10A, S10B, S11A, S11B, S12A and S12B may be operated according to the following logic table Table I, in which an "X" denotes a closed switch and "o" an open switch. The switch control signals may be provided by signals from control block 37, as illustrated.

TABLE I

| control signal Mode | control signal Motor Direction | operating mode | Motor current direction | S10A | S10B | S11A | S11B | S12A | S12B |
|---|---|---|---|---|---|---|---|---|---|
| 0 | 0 | Linear | Pos | O | X | X | O | select R1A | select R1B |
| 0 | 1 | Linear | Neg | O | X | X | O | select R1A | select R1B |
| 1 | 0 | PWM | Pos | O | X | X | O | select R1A | select R2B |
| 1 | 1 | PWM | Neg | X | O | O | X | select R2A | select R1B |

The common terminals of switches S12A, S12B are coupled to the inverting inputs of corresponding amplifiers A14A, A14B, which control the gates of transistors P10A, N0B to implement voltage-controlled current sources (VCVSs) that produce a current through resistors R7A, R7B, respectively, that is proportional to the voltage received from respective switches S12A, S12B. Another pair of amplifiers A15A, A15B, along with buffer transistors P10A, N0B and resistors R5A, R5B, produce a current through resistors R5A, R5B that shifts the common connection between resistors R5A, R6A and between resistors R5B, R6B to a common-mode reference voltage VCM. A fully-differential amplifier A16 receives the combined voltage drop across resistors R5A, R6A through resistors R11A and R13A and receives the combined voltage drop across resistors R5B, R6B through resistors R11A and R13A, but in reversed polarity, so that differential outputs Iout+ and Iout− are representative of the difference of the currents sensed by current sense resistors RS1 and RS2. Amplifiers A14A, A14B and A15A, A15B will generally be op-amps with internal offset nulling/cancellation, to ensure accuracy in the load current measurement.

Figure 5:
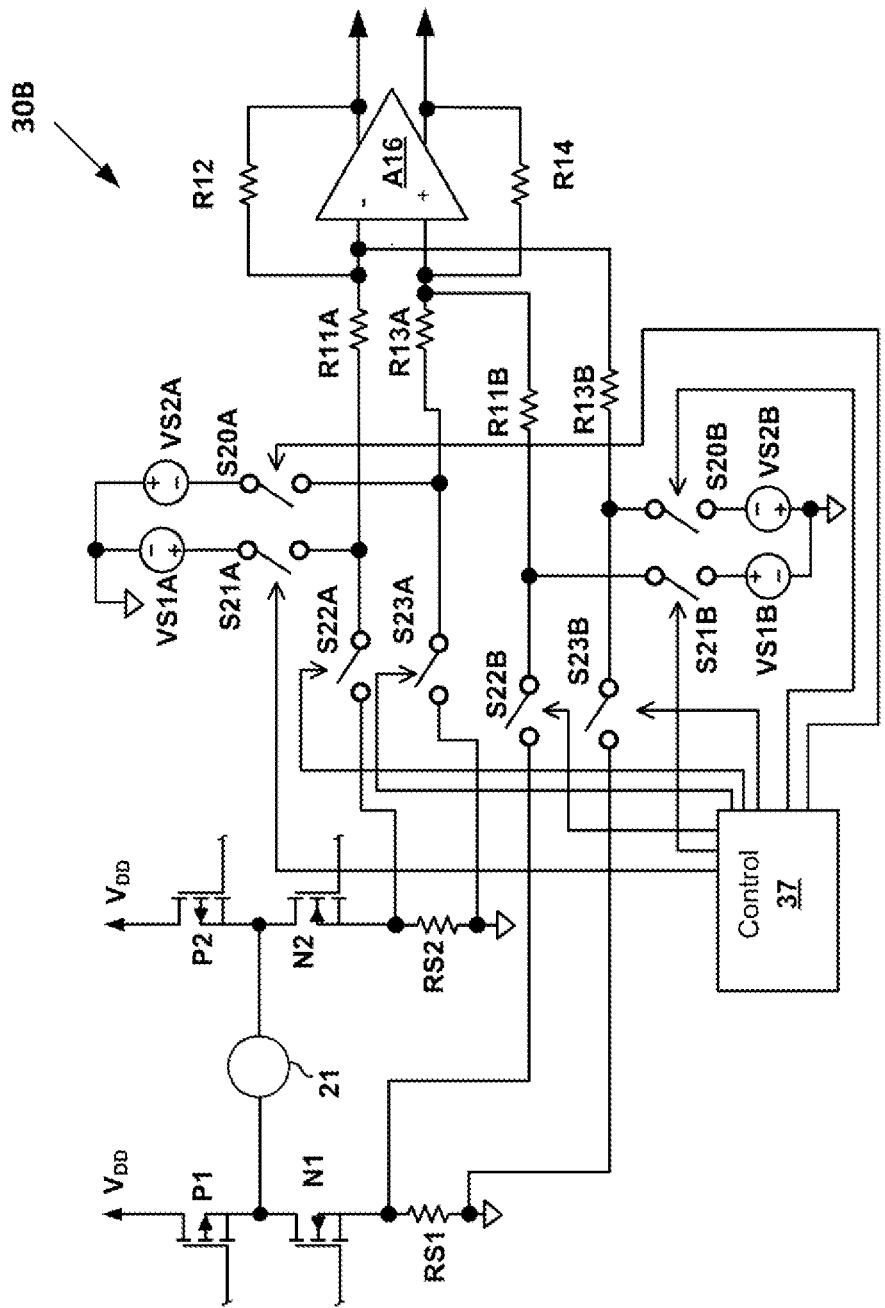
FIG. 5 is a simplified schematic diagram of an example current monitor circuit 30B that may be used to implement current monitor 30 of FIG. 3, in accordance with an embodiment of the disclosure.

Referring now to FIG. 5, a simplified schematic diagram of another imon circuit 30B that may be used to implement imon 30 of FIG. 2A and FIG. 2B is shown, in accordance with another embodiment of the disclosure. Imon circuit 30B is similar to Imon circuit 30A of FIG. 4, so only differences between them will be described in detail below. Instead of using current sources to inject the bias voltage on the imon inputs from the de-selected side of H-bridge in PWM mode, in imon 30B, two pairs of voltage sources VS1A, VS2A and VS1B, VS2B are used to inject voltages corresponding to the "missing" bias voltage at the unselected sense voltage input from one of sense resistors RS1, RS2. A pair of switches S22A, S23A selects whether inputs of amplifier A16 received through resistors R11A, R13A are connected or disconnected from sense resistor RS2. Similarly, switches S22B, S23B selects whether inputs of amplifier A16 received through resistors R11B, R13B are connected or disconnected from sense resistor RS1. When switches S22A, S23A are open, then a pair of switches S21A, S20A are closed to apply the bias voltages from voltage sources VS1A, VS2A, and when S22B, S23B are open, then a pair of switches S21B, S20B are closed to apply the bias voltages from voltage sources VS1B, VS2B. Switches 20A, 20B, 21A, 21B, 22A, 22B, 23A and S23B may be operated according to the following logic table Table II, in which an "X" denotes a closed switch and "o" an open switch. The switch control signals may be provided by signals from control block 37, as illustrated.

TABLE II

| control signal Mode | control signal Motor Direction | Motor mode | current direction | S20A | S20B | S21A | S21B | S22A/ S23A | S22B/ S23B |
|---|---|---|---|---|---|---|---|---|---|
| 0 | 0 | Linear | Pos | O | O | O | O | X | X |
| 0 | 1 | Linear | Neg | O | O | O | O | X | X |
| 1 | 0 | PWM | Pos | O | X | X | O | X | O |
| 1 | 1 | PWM | Neg | X | O | O | X | O | X |

Referring now to FIG. 6, an example signal waveform diagram illustrating operation of example motor controller 30 of FIG. 3 is shown, in accordance with an embodiment of the disclosure. At time $t_1$, a lens position command is received, represented by signal CMD, which illustrates the time period during which the command is valid. Output terminal OUT2 may be set to power supply rail $V_{SS}$ e.g., by turning transistor N2 on and transistor P2 off, in accordance with control signal Motor Direction, in an embodiment as exemplified by the above-incorporated U.S. patent application. Output terminal OUT1 is pulse-width modulated by operating transistors N1 and P1 according to the output of PWM quantizer 32. At time $t_2$, control signal MODE is de-asserted, for example, when the position of motor 21 nears the commanded position and a command is received to change the operating mode to linear. After time $t_2$, motor controller 20 operates in linear mode. In the linear operating mode, output terminals OUT1 and OUT2 are both driven as the commanded position is reached and until the end of the control of position occurs at time $t_3$. At time $t_4$, another positioning command is received with an opposite state of control signal Motor Direction. Output terminal OUT2 (and optionally output terminal OUT1) is pulse-width modulated by operating transistors N2 and P2 according to the output of PWM quantizer 32. At time $t_5$, motor controller 20 operates in linear mode and output terminals OUT2 and OUT1 are both driven as the commanded position is reached.

In summary, this disclosure shows and describes systems and integrated circuits implementing an electronic system that provides current to a load, and methods of operation of the electronic system. The electronic system may include an output stage for supplying the current to the load, and the output stage may have a first push-pull driver providing a first output for coupling to a first terminal of the load and that has a first sense resistor for providing a first sense voltage indicative of a first current in the first push-pull driver. The output stage may also include a second push-pull driver providing a second output for coupling to a second terminal of the load and that has a second sense resistor for providing a second sense voltage indicative of a second current in the second push-pull driver. The electronic system may also include a mode selection control circuit for selecting between a first operating mode and a second operating mode of the electronic system and for selecting a polarity of the current, and a current measurement circuit for receiving the first sense voltage at a first sense input and the second sense voltage at a second sense input. The current measurement system may have a control input coupled to the mode selection control circuit and that may provide a current measurement output that is dependent on both the first sense voltage and the second sense voltage in the first operating mode and is indicative of a selected one of the first sense voltage or the second sense voltage selected according to the selected polarity. The current measurement circuit may include a bias circuit that injects a bias voltage into an unselected one of the first sense input or the second sense input to maintain active operation of the unselected one of the first sense input or the second sense input.

In some example embodiments, the bias circuit may inject the bias voltage into both the first sense input and the second sense input and disable the unselected one of the first sense input or the second sense input according to the polarity of the current, so that an effect of the bias voltage is canceled in the current measurement output. In some example embodiments, in the first operating mode, the current may be sourced from either the first output or the second output independent of the selected polarity, and in the second operating mode the current may be sourced from either first output or the second output in accordance with the selected polarity. The current measurement circuit may generate the current measurement output indicative of a difference between the first sense voltage and the second sense voltage when the mode selection circuit selects the first operating mode.

In some example embodiments, the electronic system may further include a linear amplifier stage for providing a linear analog signal to an input of the output stage when the mode selection control circuit selects the first operating mode, and both the first push-pull driver and the second push-pull driver may be operated to supply the current to the load when the mode selection control circuit selects the first operating mode. The electronic system may further include a pulse-width modulator output driver for providing pulse-width modulated drive signals to the input of the output stage when the mode selection control circuit selects the second operating mode. The pulse-width modulator output driver may provide a pulse-width modulated signal to a selected one of the first push-pull driver or the second push-pull driver in conformity with the selected polarity, and may operate another one of the first push-pull driver or the second push-pull driver to supply a fixed voltage when the mode selection control circuit selects the second operating mode.

In some example embodiments, the load may be a motor, and the electronic system may be a motor controller, and the selected polarity may select a direction of movement of the motor. In some example embodiments, the electronic system may further include a feedback control loop having an input coupled to an output of the current measurement circuit and having a first output coupled to an input of the pulse-width modulator and a second output coupled to an input of the linear amplifier stage. An input may be included for receiving a current control value, and a first transfer function from the input to the selected one of the first push-pull driver or the second push-pull driver when the mode selection control circuit selects the second operating mode may be substantially equivalent to a second transfer function from the input to the combination of the first push-pull driver and the second push-pull driver when the mode selection control circuit selects the first operating mode, such that an output of a loop filter of the feedback control loop settles to approximately a same value after the mode selection control changes between the first operating mode and the second operating mode as a previous value of the output of the loop filter prior to the change. In some example embodiments, the electronic system may include an analog-to-digital converter having an input coupled to an output of the current measurement circuit for providing current measurement digital information.

In some example embodiments, when the mode selection control selects the first operating mode, the first push-pull driver and the second push-pull driver may provide a signal swing that extends substantially over a range of voltage from a negative power supply rail supplied to the output stage to a positive power supply rail supplied to the output stage. In some example embodiments, the current measurement circuit may include a differential amplifier having inputs selectively coupled to each terminal of the first sense resistor and the second sense resistor and selectively coupled to the bias circuit. In some example embodiments, the current measurement circuit may include a first amplifier having an input selectively coupled to either the first sense resistor or the bias circuit, a second amplifier having another input selectively coupled to either the first second resistor or the bias circuit, and a difference circuit for generating the current measurement output from a difference between an output of the first amplifier and another output of the second amplifier.

It should be understood, especially by those having ordinary skill in the art with the benefit of this disclosure, that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense. Similarly, although this disclosure makes reference to specific embodiments, certain modifications and changes may be made to those embodiments without departing from the scope and coverage of this disclosure. Moreover, any benefits, advantages, or solutions to problems that are described herein with regard to specific embodiments are not intended to be construed as a critical, required, or essential feature or element.

While the disclosure has shown and described particular embodiments of the techniques disclosed herein, it will be understood by those skilled in the art that the foregoing and other changes in form, and details may be made therein without departing from the spirit and scope of the disclosure. For example, the techniques shown above may be applied to a control system for supplying signals to an audio transducer or haptic device.

What is claimed is:

1. An electronic system for providing a current through a load, the electronic system comprising:
   an output stage for supplying the current to the load, the output stage having a first push-pull driver providing a first output for coupling to a first terminal of the load and having a first sense resistor for providing a first sense voltage indicative of a first current in the first push-pull driver, a second push-pull driver providing a second output for coupling to a second terminal of the load and having a second sense resistor for providing a second sense voltage indicative of a second current in the second push-pull driver;
   a mode selection control circuit for selecting between a first operating mode and a second operating mode of the electronic system and for selecting a polarity of the current; and
   a current measurement circuit for receiving the first sense voltage at a first sense input and the second sense voltage at a second sense input, wherein the current measurement circuit further comprises a switching circuit for selectively decoupling an unselected one of the first sense voltage or the second sense voltage from the current measurement circuit, wherein the switching circuit has a control input coupled to the mode selection control circuit and disables the unselected one of the first sense voltage or the second sense voltage responsive to a state of the control input, whereby the current measurement circuit provides a current measurement output that is dependent on both the first sense voltage and the second sense voltage in the first operating mode, and is indicative of a selected one of the first sense voltage or the second sense voltage selected according to the selected polarity in the second operating mode, wherein the current measurement circuit includes a bias circuit that injects a bias voltage into a corresponding one of the first sense input or the second sense input corresponding to the unselected one of the first sense voltage or the second sense voltage, so that the corresponding one of the first sense input or the second sense input receives only the bias voltage and not the unselected one of the first sense voltage or the second sense voltage, in order to maintain active operation of the corresponding one of the first sense input or the second sense input.

2. The electronic system of claim 1, wherein the bias circuit injects the bias voltage into both the first sense input and the second sense input and disables the unselected one of the first sense input or the second sense input according to the polarity of the current, so that an effect of the bias voltage is canceled in the current measurement output.

3. The electronic system of claim 1, wherein in the first operating mode, the current is sourced from either the first output or the second output independent of the selected polarity, and wherein in the second operating mode the current is sourced from either first output or the second output in accordance with the selected polarity, and wherein the current measurement circuit generates the current measurement output indicative of a difference between the first sense voltage and the second sense voltage when the mode selection circuit selects the first operating mode.

4. The electronic system of claim 3, further comprising:
   a linear amplifier stage for providing a linear analog signal to an input of the output stage when the mode selection control circuit selects the first operating mode, wherein both the first push-pull driver and the second push-pull driver are operated to supply the current to the load when the mode selection control circuit selects the first operating mode; and
   a pulse-width modulator output driver for providing pulse-width modulated drive signals to the input of the output stage when the mode selection control circuit selects the second operating mode, wherein the pulse-width modulator output driver provides a pulse-width modulated signal to a selected one of the first push-pull driver or the second push-pull driver in conformity with the selected polarity, and operates another one of the first push-pull driver or the second push-pull driver to supply a fixed voltage when the mode selection control circuit selects the second operating mode.

5. The electronic system of claim 4, wherein the load is a motor, wherein the electronic system is a motor controller, and wherein the selected polarity selects a direction of movement of the motor.

6. The electronic system of claim 1, further comprising a feedback control loop having an input coupled to an output of the current measurement circuit and having a first output coupled to an input of the pulse-width modulator and a second output coupled to an input of the linear amplifier stage.

7. The electronic system of claim 6, further comprising an input for receiving a current control value, wherein a first transfer function from the input to the selected one of the first push-pull driver or the second push-pull driver when the mode selection control circuit selects the second operating mode is substantially equivalent to a second transfer function from the input to the combination of the first push-pull driver and the second push-pull driver when the mode selection control circuit selects the first operating mode, such that an output of a loop filter of the feedback control loop settles to approximately a same value after the mode selection control changes between the first operating mode and the second operating mode as a previous value of the output of the loop filter prior to the change.

8. The electronic system of claim 1, further comprising an analog-to-digital converter having an input coupled to an output of the current measurement circuit for providing current measurement digital information.

9. The electronic system of claim 1, wherein when the mode selection control selects the first operating mode, the first push-pull driver and the second push-pull driver provide a signal swing that extends substantially over a range of voltage from a negative power supply rail supplied to the output stage to a positive power supply rail supplied to the output stage.

10. The electronic system of claim 1, wherein the current measurement circuit comprises a differential amplifier having inputs selectively coupled to each terminal of the first sense resistor and the second sense resistor and selectively coupled to the bias circuit.

11. The electronic system of claim 1, wherein the current measurement circuit comprises:
a first amplifier having an input selectively coupled to either the first sense resistor or the bias circuit;
a second amplifier having another input selectively coupled to either the first second sense resistor or the bias circuit; and
a difference circuit for generating the current measurement output from a difference between an output of the first amplifier and another output of the second amplifier.

12. A method for providing current through a load in an electronic system, the method comprising:
supplying current to the load from an output stage having a first push-pull driver provided by a first P-channel transistor coupled between a power supply rail and a first terminal of the load and a first N-channel transistor coupled between a power supply return and the load and second push-pull driver provided by a second P-channel transistor coupled between the power supply rail and the load and a second N-channel transistor coupled between the power supply return and the load;
sensing the current with a first sense resistor providing a first sense voltage indicative of a first current in the first push-pull driver and a second sense resistor providing a second sense voltage indicative of a second current in the second push-pull driver;
selecting between a first operating mode and a second operating mode of the electronic system;
selecting a polarity of the current;
measuring the current by receiving the first sense voltage at a first sense input and the second sense voltage at a second sense input, wherein the measuring is responsive to the selection of the first operating mode and the second operating mode and the selection of the polarity of the current;
selectively decoupling an unselected one of the first sense voltage or the second sense voltage from the measuring of the current responsive to selection of the second operating mode and according to the selected polarity of the current, whereby the measuring provides a current measurement output that is dependent on both the first sense voltage and the second sense voltage in the first operating mode, and is indicative of a selected one of the first sense voltage or the second sense voltage selected according to the selected polarity in the second operating mode; and
responsive to selection of the second operating mode, injecting a bias voltage into a corresponding one of the first sense input or the second sense input corresponding to the unselected one of the first sense voltage or the second sense voltage, so that the corresponding one of the first sense input or the second sense input receives only the bias voltage and not the unselected one of the first sense voltage or the second sense voltage, in order to maintain active operation of the unselected one of the first sense input or the second sense input.

13. The method of claim 12, wherein the injecting injects the bias voltage into both the first sense input and the second sense input and disables the unselected one of the first sense input or the second sense input according to the polarity of the current, so that an effect of the bias voltage is canceled in the current measurement output.

14. The method of claim 12, wherein in the first operating mode the current is sourced from either the first output or the second output independent of the selected polarity, and wherein in the second operating mode, the current is sourced from either first output or the second output in accordance with the selected polarity, and wherein the measuring the current generates the current measurement output indicative of a difference between the first sense voltage and the second sense voltage when the first operating mode is selected.

15. The method of claim 14, wherein the first operating mode is a linear operating mode, wherein the second operating mode is a pulse-width modulated operating mode, and wherein the method further comprises:
providing a linear analog signal to an input of the output stage when the selecting selects the first operating mode, wherein both the first push-pull driver and the second push-pull driver are operated to supply the current to the load in the linear operating mode; and
providing pulse-width modulated drive signals to the input of the output stage when the selecting selects the second operating mode, wherein the pulse-width modulator output driver provides a pulse-width modulated signal to a selected one of the first push-pull driver or the second push-pull driver in conformity with the selected polarity, and operates another one of the first push-pull driver or the second push-pull driver to supply a fixed voltage when the pulse-width modulated operating mode is selected.

16. The method of claim 15, wherein the load is a motor, wherein the electronic system is a motor controller, and wherein the selecting the polarity selects a direction of movement of the motor.

17. The method of claim 12, further comprising providing feedback to an input of the linear amplifier stage and an input of the pulse-width modulator by a feedback control loop having an input coupled to an output of the current measurement circuit.

18. The method of claim 17, further comprising receiving a current control value, wherein a first transfer function from the input to the selected one of the first push-pull driver or the second push-pull driver when the mode selection control circuit selects the second operating mode is substantially equivalent to a second transfer function from the input to the combination of the first push-pull driver and the second push-pull driver when the mode selection control circuit selects the first operating mode, such that an output of a loop filter of the feedback control loop settles to approximately a same value after the selecting changes selection between the first operating mode and the second operating mode as a previous value of the output of the loop filter prior to the change.

19. The method of claim 12, further comprising providing converting the current measurement output to current measurement digital information by an analog-to-digital converter for further processing of the current measurement digital information.

20. The method of claim 12, wherein when the selecting selects the first operating mode, the first push-pull driver and the second push-pull driver provide a signal swing that extends substantially over a range of voltage from a negative power supply rail supplied to the output stage to a positive power supply rail supplied to the output stage.

21. The method of claim 12, wherein the measuring the current is performed with a differential amplifier, and wherein the method further comprises:
selectively coupling inputs of the differential amplifier to each terminal of the first sense resistor and the second sense resistor; and
selectively coupling the bias circuit to the inputs of the differential amplifier.

22. The method of claim 12, wherein the measuring the current comprises:
selectively coupling an input of a first amplifier to either the first sense resistor or the bias circuit;
selectively coupling an input of a second amplifier to either the second sense resistor or the bias circuit; and
generating the current measurement output from a difference between an output of the first amplifier and an output of the second amplifier.

* * * * *

UNITED STATES PATENT AND TRADEMARK OFFICE
CERTIFICATE OF CORRECTION

PATENT NO. : 12,163,984 B2
APPLICATION NO. : 17/510675
DATED : December 10, 2024
INVENTOR(S) : Parupalli et al.

It is certified that error appears in the above-identified patent and that said Letters Patent is hereby corrected as shown below:

On the Title Page

In Item (57), under "Abstract", in Column 2, Line 2, delete "to a" and insert -- to --, therefor.

In the Drawings

In Fig. 4, Sheet 4 of 9, and on the Title Page, the lower-right occurrence of P11A (adjacent to R7B), delete "P11A" and insert -- P11B --, therefor.

In the Specification

In Column 2, Line 17, delete "such", therefor.

In Column 2, Line 18, delete "mode that" and insert -- , and that --, therefor.

In Column 6, Line 66, delete "corresponding of" and insert -- corresponding one of --, therefor.

In Column 7, Line 53, delete "HA" and insert -- I1A --, therefor.

In Column 7, Line 56, delete "to" and insert -- I1B to --, therefor.

In Column 8, Line 22, delete "P10A,NOB" and insert -- P11A,P11B --, therefor.

In Column 8, Line 26, delete "NOB" and insert -- P10B --, therefor.

Signed and Sealed this
Fourth Day of March, 2025

Coke Morgan Stewart
*Acting Director of the United States Patent and Trademark Office*